(12) United States Patent
Orita et al.

(10) Patent No.: US 6,344,375 B1
(45) Date of Patent: Feb. 5, 2002

(54) SUBSTRATE CONTAINING COMPOUND SEMICONDUCTOR, METHOD FOR MANUFACTURING THE SAME AND SEMICONDUCTOR DEVICE USING THE SAME

(75) Inventors: Kenji Orita; Masahiro Isida; Shinji Nakamura; Masaaki Yuri; Nobuyuki Uemura, all of Osaka (JP)

(73) Assignee: Matsushita Electric Industrial Co., Ltd, Osaka (JP)

( * ) Notice: Subject to any disclaimer, the term of this patent is extended or adjusted under 35 U.S.C. 154(b) by 0 days.

(21) Appl. No.: 09/357,477

(22) Filed: Jul. 20, 1999

(30) Foreign Application Priority Data

Jul. 28, 1998 (JP) .......................................... 10-212157

(51) Int. Cl.$^7$ .......................... H01L 21/00; H01L 21/80
(52) U.S. Cl. ........................ 438/151; 438/455; 438/457
(58) Field of Search ................................ 438/455, 456, 438/457, 151, 152, 153, 607

(56) References Cited

U.S. PATENT DOCUMENTS

| | | |
|---|---|---|
| 5,239,188 A | 8/1993 | Takeuchi et al. |
| 5,272,355 A | 12/1993 | Namavar et al. |
| 5,764,673 A | 6/1998 | Kawazu et al. |
| 5,814,533 A * | 9/1998 | Shakuda ........................ 438/46 |
| 6,015,979 A * | 1/2000 | Sugiura et al. ................ 257/86 |
| 6,100,166 A * | 8/2000 | Sakaguchi et al. ........... 438/455 |
| 6,143,629 A * | 11/2000 | Sato ............................ 438/455 |

FOREIGN PATENT DOCUMENTS

| | | |
|---|---|---|
| JP | 5-21361 | 1/1993 |
| JP | 2000-21789 A * | 1/2000 |

* cited by examiner

Primary Examiner—Michael S. Lebentritt
(74) Attorney, Agent, or Firm—Merchant & Gould PC

(57) ABSTRACT

A substrate containing a compound semiconductor layer comprises a substrate layer 11, a first semiconductor layer 12 formed on the substrate layer 11, and a second semiconductor layer 13 made of a Group III nitride-based compound semiconductor formed on the first semiconductor layer 12. The semiconductor layer 12 is provided with a plurality of pores 14. Thus, a compound semiconductor layer containing a Group III nitride-based compound semiconductor with excellent surface planarity and crystallinity can be provided, as well as a method for manufacturing the same, and a semiconductor device using the same.

17 Claims, 15 Drawing Sheets

SUBSTRATE CONTAINING COMPOUND SEMICONDUCTOR, METHOD FOR MANUFACTURING THE SAME AND SEMICONDUCTOR DEVICE USING THE SAME

BACKGROUND OF THE INVENTION

1. Field of the Invention

The present invention relates to a substrate containing a compound semiconductor layer, a method for manufacturing the same, and a semiconductor device using the same.

2. Description of the Prior Art

In recent years, semiconductor devices, for example blue-light-emitting elements or high-temperature high-speed transistors, using a Group III nitride compound semiconductor as expressed by the general formula $Ga_xAl_yIn_zN$ ($0 \leq x \leq 1$; $0 \leq y \leq 1$; $0 \leq z \leq 1$; $x+y+z=1$) have gained widespread attention. To make such a semiconductor device, a Group III nitride-based compound semiconductor is formed on a sapphire substrate or a silicon carbide (SiC) substrate by crystal growth, since it is difficult to obtain a single crystal substrate made of a Group III nitride-based compound semiconductor.

Recently, Group III nitride-based compound semiconductors formed on a silicon (Si) substrate and growth methods for the same have been proposed (see for example Publication of Unexamined Japanese Patent Application (Tokkai) No. Hei 5-343741 and Tokkai Hei 9-92882). Silicon substrates can be produced at low cost and with high diameters, they are semi-conducting and have good cleavage, they have better heat conductivity than sapphire for example, and their good heat conductivity is advantageous when they are used for light-emitting devices.

FIG. 13 shows an example of a conventional Group III nitride-based compound semiconductor substrate, made with a Si substrate. As shown in FIG. 13, this conventional Group III nitride-based compound semiconductor substrate includes a Si substrate layer 1, a buffer layer 2 deposited on the Si substrate layer 1, and an epitaxial layer 3 made of a Group III nitride compound semiconductor. The buffer layer 2 is made of, for example, a Group III nitride compound semiconductor expressed by the general formula $Ga_tAl_{1-t}N$ (with $0 \leq t < 1$), amorphous Si, or polycrystalline Si.

FIG. 14 illustrates a conventional method for manufacturing the Group III nitride compound semiconductor shown in FIG. 13. First, a buffer layer 2 is formed on a Si substrate 1, as shown in FIG. 14(a). Then, an epitaxial layer 3 is grown on the buffer layer 2, as shown in FIG. 14(b).

However, if such a conventional buffer layer 2 is used, there is the problem that lattice mismatching between the substrate layer 1 and the epitaxial layer 3 cannot be relaxed sufficiently, and the crystallinity of the epitaxial layer 3 is insufficient. Moreover, if amorphous Si or polycrystalline Si is used for the buffer layer 2, there is the problem that the surface planarity of the epitaxial layer is poor. Also, there is the problem that in most cases, the hardness of the Group III nitride compound semiconductor layer is higher than the hardness of the substrate, which causes strain in the epitaxial layer 3 and easily can result in cracks in the epitaxial layer 3.

SUMMARY OF THE INVENTION

It is an object of the present invention to solve these problems, and to provide a substrate containing a compound semiconductor layer including a Group III nitride-based compound semiconductor with good surface planarity and crystallinity, a method for manufacturing the same, and a semiconductor device using the same.

An inventive substrate containing a compound semiconductor layer includes a substrate layer, a first semiconductor layer formed on the substrate layer, and a second semiconductor layer formed on the first semiconductor layer. The first semiconductor layer has a plurality of pores. The second semiconductor layer is made of a Group III nitride-based compound semiconductor (that is, a III–V compound semiconductor including mainly a Group III nitride compound semiconductor, for example a III–V compound semiconductor in which nitrogen accounts for at least 90% of the Group V atoms). In this substrate, a first semiconductor layer having a plurality of pores is formed on a substrate layer. This first semiconductor layer absorbs strain due to lattice mismatching between the substrate layer and the Group III nitride-based compound semiconductor layer and also strain due to a difference of their thermal expansion coefficients. Consequently, a substrate containing a compound semiconductor layer including a Group III nitride-based semiconductor with excellent crystallinity and surface planarity can be obtained. Furthermore, since strain in the second semiconductor layer is suppressed, cracks due to the high hardness of the Group III nitride-based semiconductor can be avoided.

It is preferable that the first semiconductor layer of the inventive substrate is a buffer layer, and the second semiconductor layer is an epitaxial layer.

It is preferable that the substrate layer in this inventive substrate is made of a Si single crystal, and the first semiconductor layer is made of a Si single crystal having a plurality of pores. With this configuration, the crystal orientation of the Group III nitride-based compound semiconductor formed thereon can be aligned. Also, since Si has excellent heat radiation properties, the heat radiation properties of the substrate containing a compound semiconductor layer obtained with this configuration are excellent. Also, since this configuration suppresses strain in the epitaxial layer, the number of cracks in the epitaxial layer can be reduced, even when the hardness of the Group III nitride-compound semiconductor is higher than the hardness of the Si.

In the substrate according to the present invention, it is preferable that the substrate layer is made of a Si single crystal, and the first semiconductor layer includes a Si single crystal layer having a plurality of pores, and a Group III nitride-based compound semiconductor layer formed on the Si single crystal layer. Since in this configuration a first semiconductor layer including a Si single crystal layer having a plurality of pores, and a Group III nitride-based compound semiconductor layer functions as the buffer layer, the crystal orientation of the Group III nitride-based compound semiconductor layer, i.e. the epitaxial layer, can be aligned even better. Moreover, the Group III nitride-based compound semiconductor can relax bumps in the substrate surface that originate in the Si having a plurality of pores.

It is preferable that the first semiconductor layer in the substrate according to the present invention is made of a Group III nitride-based compound semiconductor. With this configuration, the crystallinity of the substrate containing a compound semiconductor layer can be improved even more.

It is preferable that the first semiconductor layer in the substrate according to the present invention includes a dopant. This configuration facilitates the formation of the pores. It is preferable that the average diameter of the pores in the substrate according to the present invention is at least 3 nm and at most 10 nm. If the average diameter of the pores is at least 3 nm, the lattice mismatch between the substrate layer and the second semiconductor layer can be relaxed effectively. If the diameter of the pores is at most 10 nm, the pores do not deteriorate the surface morphology of the second semiconductor layer.

In accordance with the present invention, a method for manufacturing a substrate containing a compound semiconductor layer includes a first step of forming a semiconductor layer having a plurality of pores on a substrate layer, and a second step of epitaxially growing a Group III nitride-based compound semiconductor layer on the semiconductor layer. In this manufacturing method, the semiconductor layer having a plurality of pores functions as a buffer layer, so that a Group III nitride-based compound semiconductor with good crystallinity can be grown epitaxially. Consequently, with this manufacturing method, a substrate containing a compound semiconductor layer including a Group III nitride-based compound semiconductor with excellent crystallinity and surface planarity can be manufactured. In particular, it is possible to suppress strain in the Group III nitride-based compound semiconductor layer.

In the method according to the present invention, it is preferable that the substrate layer is made of a Si single crystal, the semiconductor layer includes a Si single crystal layer provided with a plurality of pores, and the first step includes anodic oxidization of the Si single crystal. By using a Si single crystal substrate for the substrate layer, an electrode can be formed on the back surface of the substrate layer, and it is possible to manufacture a substrate containing a compound semiconductor layer that is suitable for a semiconductor device. Also, a Si single crystal having pores can be manufactured easily by including a step of anodic oxidization of the Si single crystal in the first step.

In the method according to the present invention, it is preferable that the semiconductor layer further includes a buffer layer made of a Group III nitride-based compound semiconductor formed on the Si single crystal layer, and the first step includes forming the buffer layer on the Si single crystal layer after the anodic oxidization. With this configuration, bumps due to the pores can be relaxed, so that a Group III nitride-based compound semiconductor with even better surface planarity and crystallinity can be grown epitaxially.

In the method according to the present invention, it is preferable that the semiconductor layer is made of a Group III nitride-based compound semiconductor. With this configuration, a Group III nitride-based compound semiconductor with particularly good crystallinity can be grown epitaxially.

In the method according to the present invention, it is preferable that the first step includes forming a semiconductor film made of a Group III nitride-based compound semiconductor, and subsequently providing the semiconductor film with pores by etching the semiconductor film in an acid or basic aqueous solution. With this configuration, a semiconductor layer having a plurality of pores can be manufactured easily.

In the method according to the present invention, it is preferable that the semiconductor film includes a dopant, and the first step further includes applying a voltage to the semiconductor film while etching the semiconductor film. With this configuration, a semiconductor layer having a plurality of pores can be manufactured even more easily.

It is preferable that the method according to the present invention includes a third step of forming a substrate made of a Group III nitride-based compound semiconductor by removing the substrate and the semiconductor layer. With this configuration, it is possible to form a substrate made of a Group III nitride-compound semiconductor.

A first semiconductor device in accordance with the present invention includes the above inventive substrate containing a compound semiconductor layer.

A second semiconductor device in accordance with the present invention includes a substrate containing a compound semiconductor layer manufactured with the above method for manufacturing a substrate containing a compound semiconductor layer of the present invention.

DESCRIPTION OF THE PREFERRED EMBODIMENTS

First Embodiment

The following is an example of a first embodiment for a substrate containing a compound semiconductor layer in accordance with the present invention.

Figure 1:
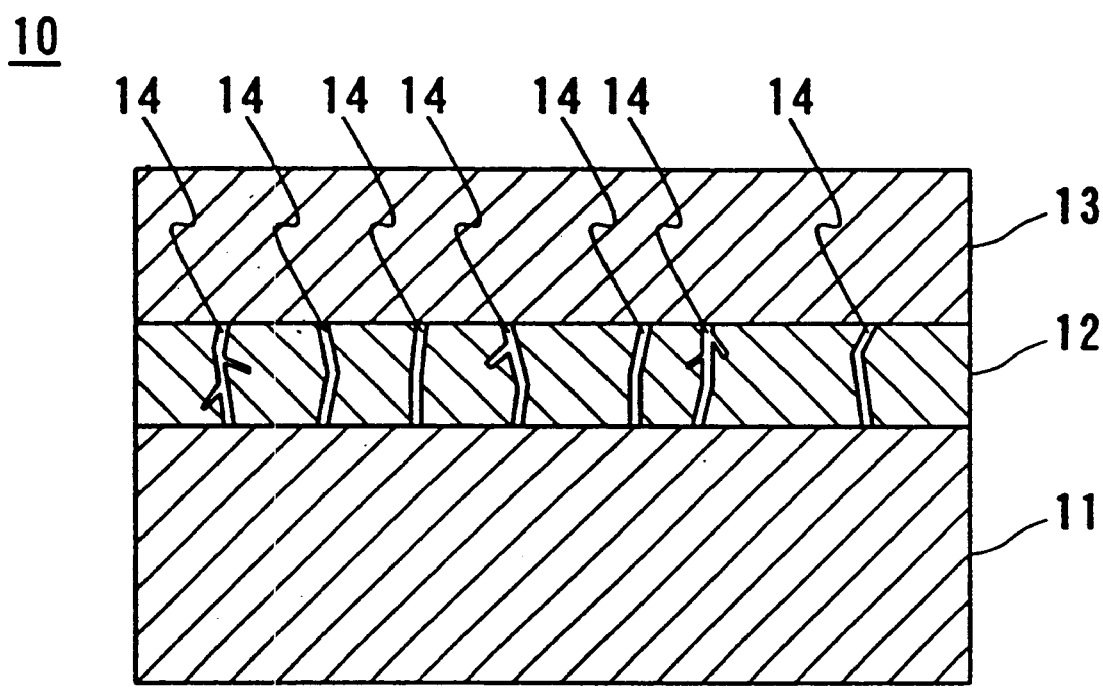
FIG. 1 is a cross-sectional view showing an example of a substrate containing a compound semiconductor layer in accordance with the present invention.

FIG. 1 is a cross-sectional drawing of a substrate 10 containing a compound semiconductor layer in accordance with the first embodiment. In the following, the substrate 10 containing a compound semiconductor layer is also referred to simply as "substrate 10". The substrate 10 in accordance with the first embodiment includes a substrate layer 11, a semiconductor layer 12 (first semiconductor layer) formed on the substrate layer 11, and a semiconductor layer 13 (second semiconductor layer; referred to as "epitaxial layer" in the following) formed on the semiconductor layer 12. The epitaxial layer 13 is made of a Group III nitride-based compound semiconductor (i.e., it is a III–V compound semiconductor having mainly nitrogen as the group V element).

Various kinds of substrates can be used for the substrate layer 11, for example semiconductor substrates such as Si (111) substrates, SiC (0001) substrates, or GaAs (111) substrates, or insulating substrates such as sapphire (0001) substrates or spinel substrates. If a semiconductor substrate is used for the substrate layer 11, it also can contain a dopant.

The semiconductor layer 12 is made of a semiconductor and contains a plurality of pores 14. It is preferable that the pores 14 formed in the semiconductor layer 12 have an average diameter at least 3 nm and at most 10 nm. By making the average diameter of the pores 14 at least 3 nm, the crystallinity of the epitaxial layer 13 can be improved. By making the average of the pores 14 at most 10 nm, deterioration of the surface morphology of the epitaxial layer 13 can be prevented. It is also preferable that the thickness of the semiconductor layer 12 is at least 0.1 $\mu$m and at most 10 $\mu$m. Moreover, the porosity of the semiconductor layer 12 (porosity=volume of the pores 14/volume of the entire semiconductor layer 12) is, for example, greater than zero and at most 0.7.

For the semiconductor layer 12, a semiconductor is used that relaxes the difference of the lattice constants and of the thermal expansion coefficients between the substrate layer 11 and the epitaxial layer 13. For example, Si or a Group III nitride-based compound semiconductor can be used for the semiconductor layer 12. If a Si single crystal is used for the substrate layer 11, a semiconductor layer 12 of porous Si can be formed easily by anodic oxidization of the substrate layer 11. The Group III nitride-based compound semiconductor for the semiconductor layer 12 can be, for example, a Group III nitride compound semiconductor of the general formula $Ga_xAl_yIn_zN$ (with $0 \leq x \leq 1$; $0 \leq y \leq 1$; $0 \leq z \leq 1$; $x+y+z=1$). During the manufacturing of the substrate 10, this semiconductor layer 12 functions as a buffer layer. It is sufficient if at least a portion of the semiconductor layer 12 is provided with the pores 14.

The epitaxial layer 13 is made of a Group III nitride compound semiconductor crystal. The Group III nitride-based compound semiconductor used for the epitaxial layer 13 can be, for example, a compound semiconductor of the general formula $Ga_xAl_yIn_zN$ (with $0 \leq x \leq 1$; $0 \leq y \leq 1$; $0 \leq z \leq 1$; $x+y+z=1$). It is also possible that the epitaxial layer 13 includes a plurality of Group III nitride-based compound semiconductors.

In this substrate 10 according to the first embodiment, the epitaxial layer 13 made of a Group III nitride-based compound semiconductor is formed on top of the semiconductor layer, which has a plurality of pores. Consequently, in the substrate of this embodiment, the lattice mismatch between the substrate layer 11 and the epitaxial layer 13 can be relaxed, so that a substrate having a compound semiconductor layer based on a Group III nitride with excellent crystallinity and surface planarity can be obtained.

The semiconductor layer 12 in this substrate 10 according to the first embodiment also can include a plurality of semiconductor layers. Examples of such a substrate 10 are shown FIG. 2(a), which illustrates a substrate 10a, and in FIG. 2(b), which illustrates a substrate 10b.

Figure 2A:
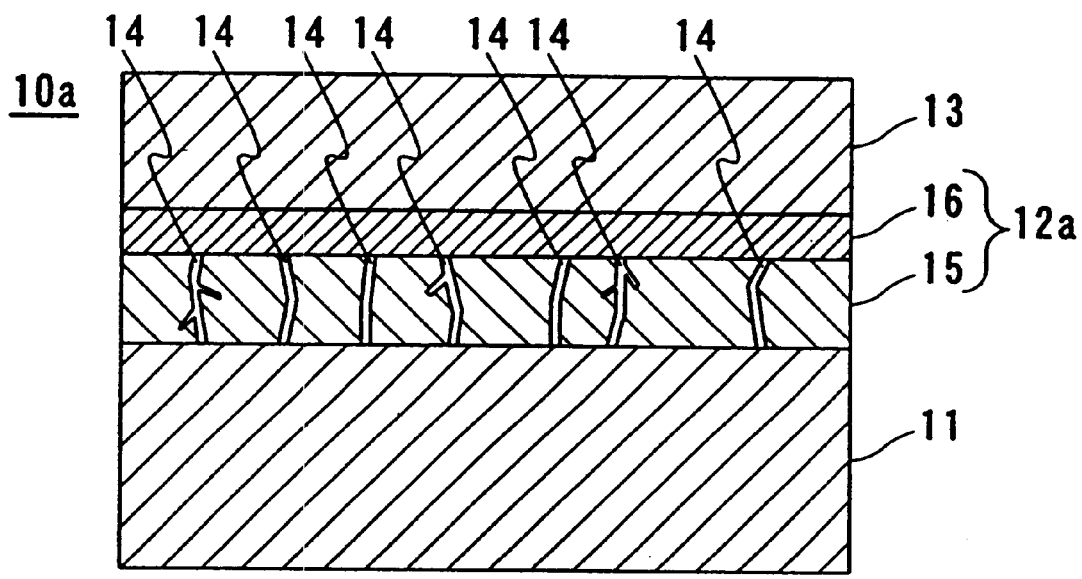
FIGS. 2(a) and (b) are cross-sectional views showing another example of a substrate containing a compound semiconductor layer in accordance with the present invention.

The substrate 10a containing a compound semiconductor layer, shown in FIG. 2(a), includes a substrate layer 11, a semiconductor layer 12a, and an epitaxial layer 13. The semiconductor layer 12a includes a semiconductor layer 15 formed on the substrate layer 11 and a semiconductor layer 16 formed on the semiconductor layer 15. The semiconductor layer 15 has a plurality of pores 14. In this substrate 10a, for example a Si single crystal can be used for the substrate layer 11, a Si single crystal having a plurality of pores (for example, porous Si) can be used for the semiconductor layer 15, and a Group III nitride-based compound semiconductor can be used for the semiconductor layer 16.

Figure 2B:
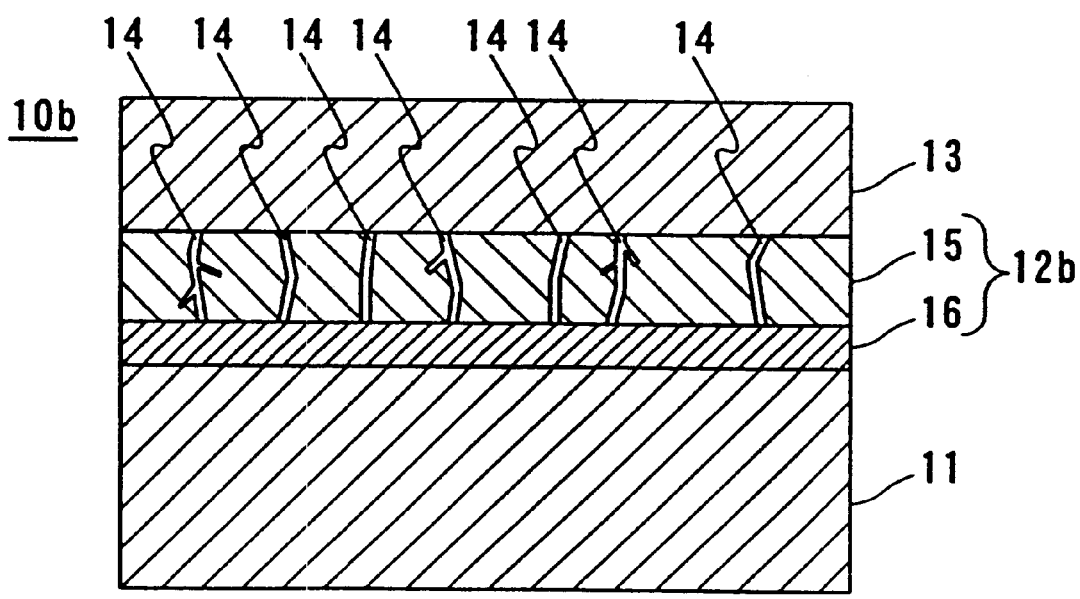

The substrate 10b containing a compound semiconductor layer shown in FIG. 2(b), includes a substrate layer 11, a semiconductor layer 12b, and an epitaxial layer 13. The semiconductor layer 12b includes a semiconductor layer 16 formed on the substrate layer 11 and a semiconductor layer 15 formed on the semiconductor layer 16. The semiconductor layer 15 has a plurality of pores 14. In this substrate 10b, for example a Group III nitride-based compound semiconductor can be used for the semiconductor layers 15 and 16. In this case, by doping the semiconductor layer 15 with p-type or n-type dopant and leaving the semiconductor layer 16 undoped, pores 14 can be formed easily in semiconductor layer 15 only.

Second Embodiment

The following is an explanation of a second embodiment of the present invention, referring to an example of a method for manufacturing a substrate 10 in accordance with the first embodiment. The explanation of parts already explained for the first embodiment is omitted.

A method for manufacturing a substrate containing a compound semiconductor layer in accordance with the present invention includes a first step of forming a semiconductor having a plurality of pores on a substrate layer, and a second step of epitaxially growing a Group III nitride-based compound semiconductor layer on the semiconductor layer. Methods for manufacturing a substrate containing a compound semiconductor layer in accordance with the present invention also include methods for manufacturing a substrate containing only a Group III nitride-based compound semiconductor layer.

Of the methods for manufacturing a substrate containing a compound semiconductor layer in accordance with the present invention, the second embodiment refers in particular to a method wherein the substrate layer 11 is a Si single crystal substrate layer, the semiconductor layer 12 is a Si single crystal having a plurality of pores 14 (referred to as "porous Si" in the following), and the first step includes anodic oxidization of the Si single crystal.

Figure 3A:
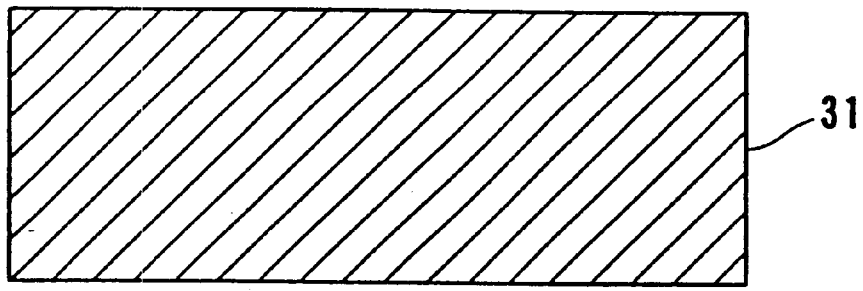
FIGS. 3(a) to 3(c) are drawings illustrating an example of a method for manufacturing a substrate containing a compound semiconductor layer in accordance with the present invention.

In the manufacturing method of the second embodiment, first, a substrate 31 made of a Si single crystal as shown in FIG. 3(a) is prepared and subjected to anodic oxidization.

Figure 4:
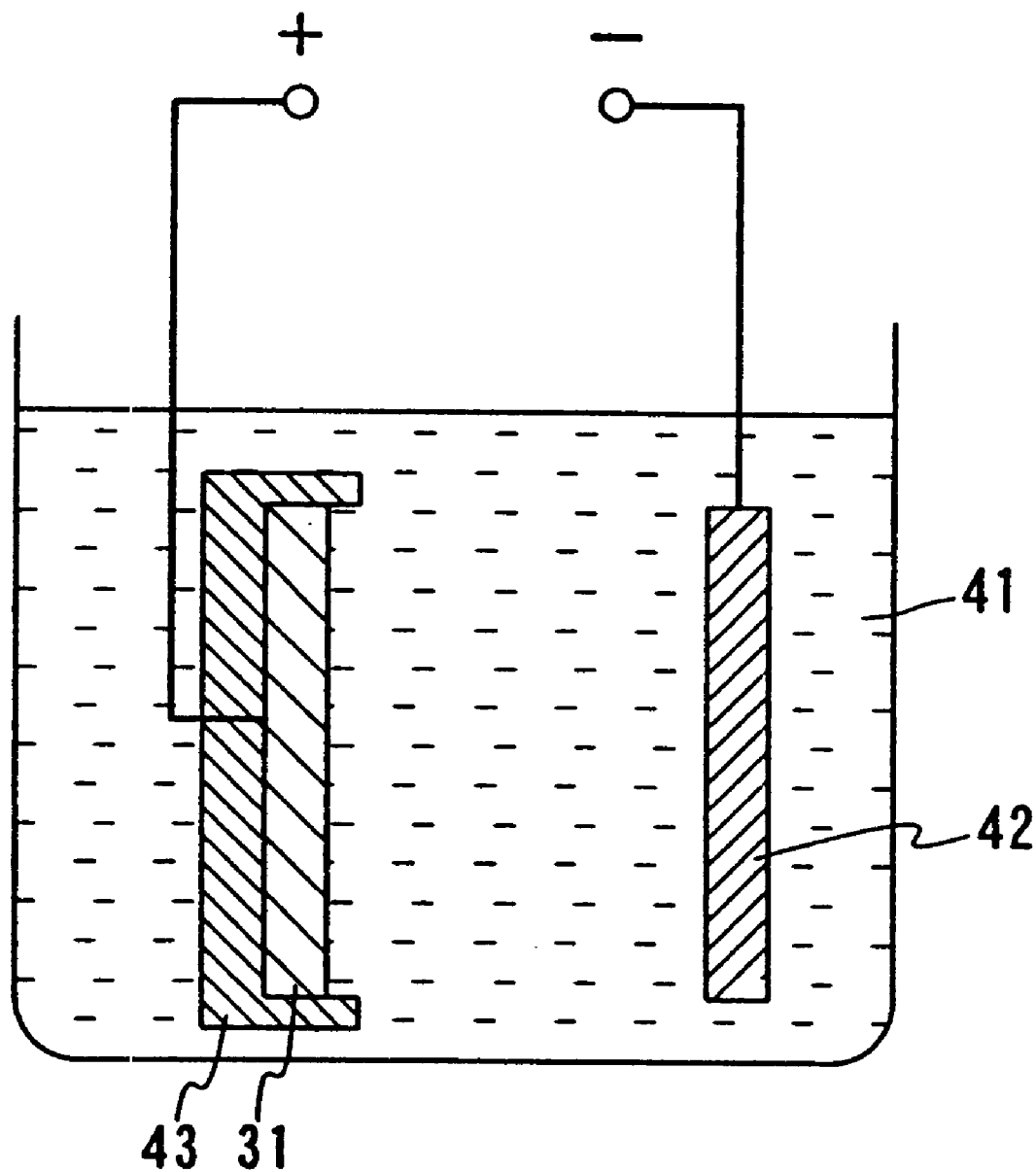
FIG. 4 is a schematic drawing illustrating an example of a step of a method for manufacturing a substrate containing a compound semiconductor layer in accordance with the present invention.

This anodic oxidization is illustrated schematically in FIG. 4. The anodic oxidization is performed by immersing the substrate 31 in a solution 41, and applying a voltage between the substrate 31 and the electrode 42 to generate a dc current. This voltage is applied so that the substrate 31 becomes the anode and the electrode 42 becomes the cathode. In this anodic oxidization, the $SiO_2$ formed by oxidizing the surface of the Si single crystal is eluted with hydrofluoric acid, so as to form the plurality of pores 14. The average diameter of these pores 14 is, for example, 3 nm to 10 nm.

An aqueous solution including, for example, hydrofluoric acid and ethanol can be used for the solution 41. The temperature of the solution 41 is, for example, 5° C. to 70° C. The electrode 42 can be a platinum electrode, for example. The current density running through the substrate 31 can be, for example, 5 $mA/cm^2$ to 300 $mA/cm^2$. It is preferable that, during the anodic oxidization, a protective film 43 covers the portion wherein the pores 14 are not to be formed, because this allows the formation of pores 14 only at the desired portions.

Figure 3B:
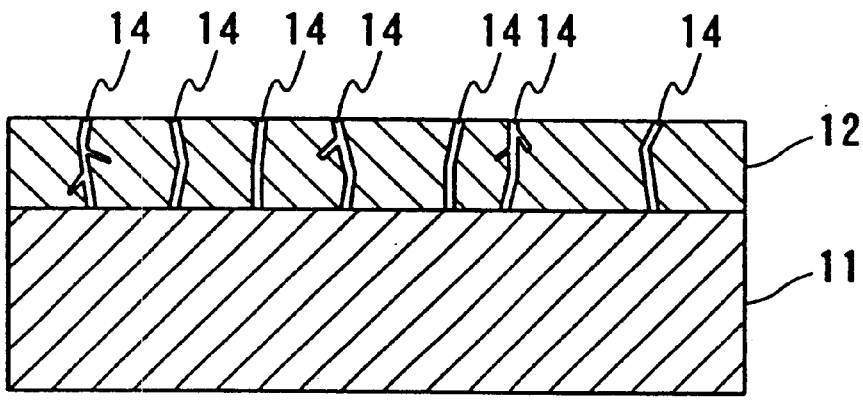

With this anodic oxidization, the oxidized portions turn into a semiconductor layer 12 of porous Si, so that a substrate layer 11 made of a Si single crystal and a semiconductor layer 12 can be obtained, as shown in FIG. 3(b).

Figure 3C:
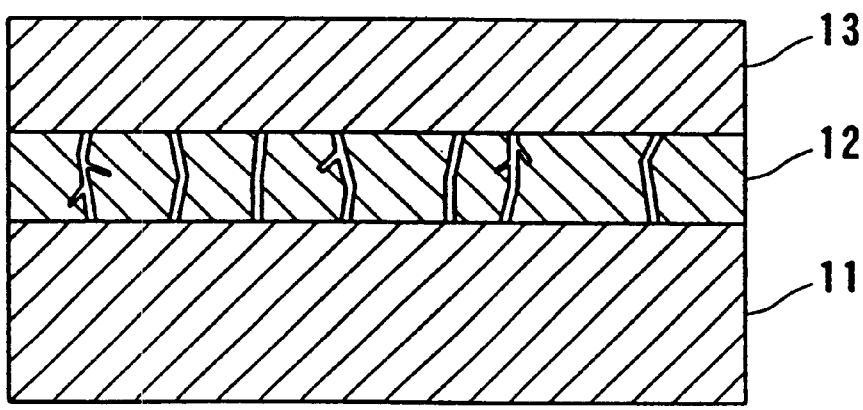

Then, a Group III nitride-based compound semiconductor is grown epitaxially on the semiconductor layer 12, an epitaxial layer, as shown in FIG. 3(c). During the formation of the epitaxial layer 13, the semiconductor layer 12 functions as a buffer layer. Possible methods for epitaxially growing a Group III nitride-based compound semiconductor include, for example, MOCVD (metal organic chemical vapor deposition) and HVPE (hydride vapor phase epitaxy). The epitaxial layer 13 is formed at a crystal formation temperature of 650° C. to 1150° C.

Thus, a substrate 10 including an epitaxial layer made of a Group III nitride-based compound semiconductor can be manufactured.

An example of a method for manufacturing the substrate 10a shown in FIG. 2 is explained with reference to FIG. 5.

Figure 5A:
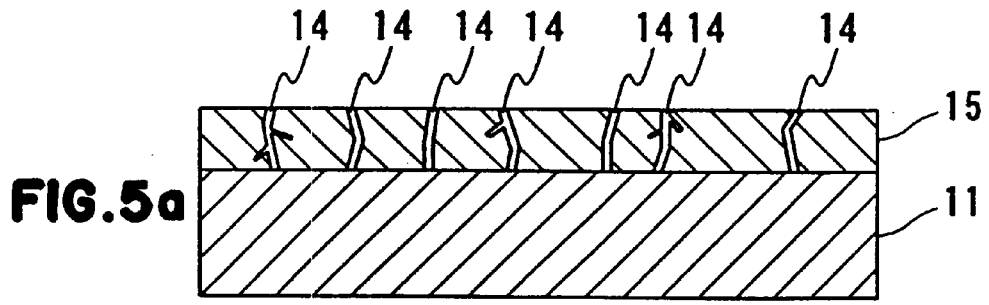
FIGS. 5(a) to 5(c) are drawings illustrating another example of a method for manufacturing a substrate containing a compound semiconductor layer in accordance with the present invention.

In this example, first, anodic oxidization is performed with the method explained in FIG. 4, to form a substrate layer 11 made of a Si single crystal and a semiconductor layer 15 made of porous Si formed on top of the substrate layer 11, as shown in FIG. 5(a).

Figure 5B:
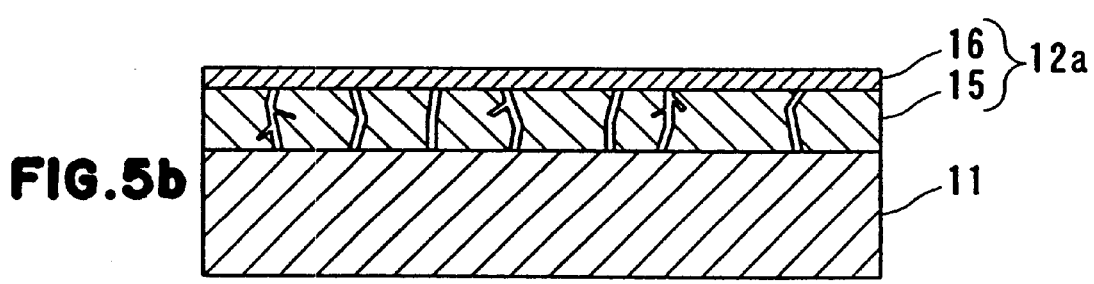

Then, a semiconductor layer 16 made of a Group III nitride-based compound semiconductor is formed on the semiconductor layer 15, as shown in FIG. 5(b). This semiconductor layer 16 can be formed, for example, by MOCVD. The semiconductor layer 16 functions as a buffer layer, and it is preferable that it is formed at a substrate temperature of 400° C. to 900° C. If the semiconductor layer 16 is formed at a temperature of 400° C. to 900° C., the Group III nitride-based compound semiconductor of the semiconductor layer 16 can be recrystallized into a single crystal during the formation of the epitaxial layer 13, and an epitaxial layer 13 with well aligned crystal orientation can be obtained.

Figure 5C:
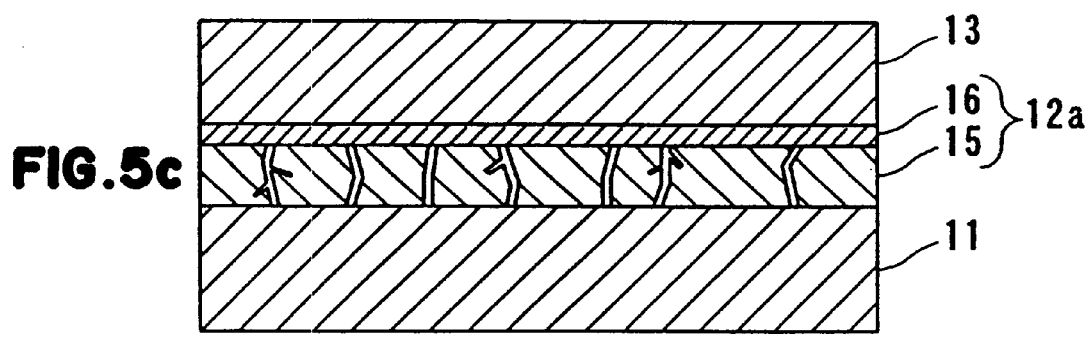

Then, an epitaxial layer 13 made of a Group III nitride-based compound semiconductor is grown on the semiconductor layer 16, as shown in FIG. 5(c). The method for forming the epitaxial layer 13 is the same as explained in FIG. 4(c), so that a further explanation has been omitted.

In this manufacturing method of the second embodiment, a Group III nitride-based compound semiconductor is grown epitaxially on a semiconductor layer 12 having a plurality of pores. Therefore, with this method for manufacturing a substrate containing a compound semiconductor layer according to the second embodiment, the semiconductor layer 12 relaxes the lattice mismatching between the substrate layer 11 and the epitaxial layer 13, and a substrate containing a Group III nitride-based compound semiconductor layer having excellent crystallinity and surface planarity can be obtained.

Especially, since in this manufacturing method of the second embodiment, a Si single crystal substrate is used for the substrate layer 11, a substrate containing a compound semiconductor layer that is suitable for semiconductor devices can be obtained. For example, if a semiconductor device, for example a semiconductor laser, is formed using an insulating substrate, such as a sapphire substrate, a p-side electrode and an n-side electrode have to be formed on the side of the semiconductor layer, which makes the process very complicated. There is also the problem that since the thermal conductivity of the sapphire substrate is low, it is difficult to dissipate the heat generated by the device through the substrate. Moreover, since sapphire substrates have poor cleavage, there is the problem of low yield when using them to manufacture semiconductor devices. On the other hand, since these problems do not occur when using a Si single crystal substrate, a substrate containing a compound semiconductor layer that is suitable for semiconductor devices can be obtained with the manufacturing method of the second embodiment. Moreover, as single crystal substrates can be produced at low cost and with large diameters, the manufacturing method of the second embodiment allows the manufacturing of substrates containing a compound semiconductor layers at low costs.

Moreover, the manufacturing method of the second embodiment uses porous Si formed by anodic oxidization of a Si single substrate for the semiconductor layer 12. Therefore, an epitaxial layer 13 with excellent crystallinity and surface planarity can be produced, in contrast to conventional methods that used polycrystalline Si or amorphous Si for the buffer layer.

It is also possible to manufacture a substrate containing only a Group III nitride-based compound semiconductor layer by removing the substrate layer 11 and the semiconductor layer 12 after manufacturing a substrate 10 with the method of the second embodiment. (The same is true also the following embodiments.) The substrate layer 11 and the semiconductor layer 12 can be removed, for example, by mechanical abrasion or by etching.

Third Embodiment

The following is an explanation of a third embodiment of the present invention, referring to another method for manufacturing a substrate containing a compound semiconductor layer in accordance with the present invention. Of the methods for manufacturing a substrate containing a compound semiconductor layer in accordance with the present invention, the third embodiment refers in particular to a method wherein the semiconductor layer 12 is made of a Group III nitride-based compound semiconductor, and has a plurality of pores 14. Explanations already covered by the above embodiments are omitted.

Figure 6A:
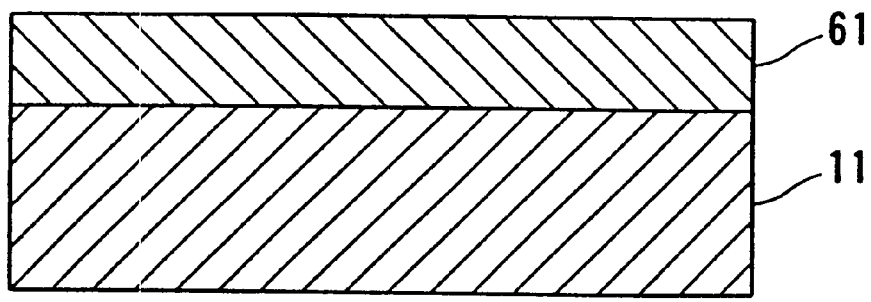
FIGS. 6(a) to 6(c) are drawings illustrating yet another example of a method for manufacturing a substrate containing a compound semiconductor layer in accordance with the present invention.

In the manufacturing method of the third embodiment, first, a semiconductor film 61 made of a Group III nitride-based compound semiconductor is formed on a substrate layer 11, as shown in FIG. 6(a). For example, a Group III nitride compound semiconductor as expressed by the general formula $Ga_xAl_yIn_zN$ (with $0 \leq x \leq 1$; $0 \leq y \leq 1$; $0 \leq z \leq 1$; $x+y+z=1$) can be used for the semiconductor film 61.

Figure 6B:
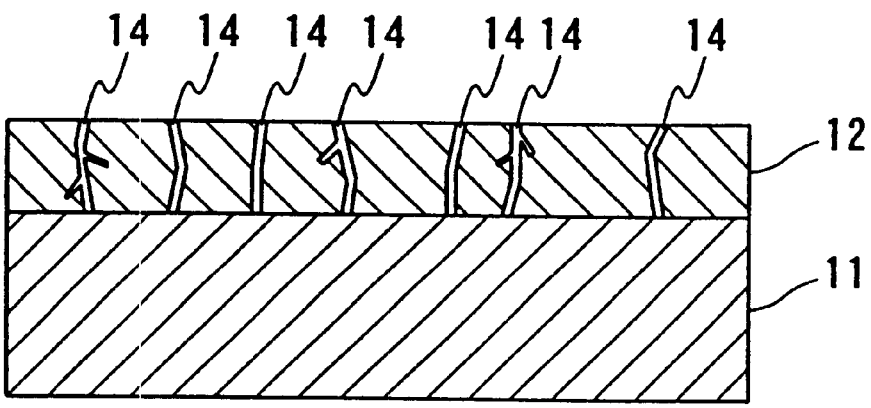

Then, a semiconductor layer 12 is formed by forming a plurality of pores in the semiconductor film 61, as shown in FIG. 6(b).

Figure 6C:
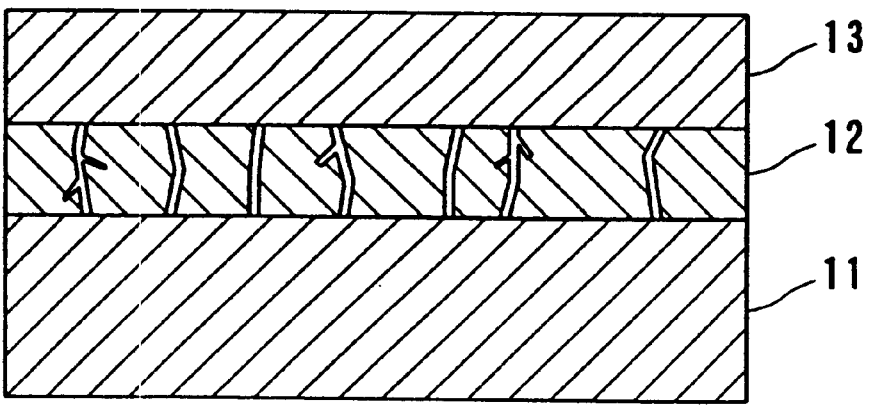

Then, a Group III nitride-based compound semiconductor is grown epitaxially on the semiconductor layer 12, to form an epitaxial layer 13, as shown in FIG. 6(c). During the formation of the epitaxial layer 13, the semiconductor layer 12 functions as a buffer layer. Thus, a substrate 10 containing a compound semiconductor layer can be manufactured.

The step of 6(b), that is, the formation of a plurality of pores 14 in the semiconductor film 61, can be performed by etching the substrate layer 11 with the semiconductor film 61 in an aqueous acid or basic solution. Aqueous solutions containing potassium hydroxide, sulfuric acid, phosphoric acid, or especially concentrated phosphoric acid for example are suitable for such a solution. It is preferable that during the formation of the pores, a voltage is applied making the semiconductor film 61 the anode, as in the anodic oxidization illustrated in FIG. 4.

Figure 7:
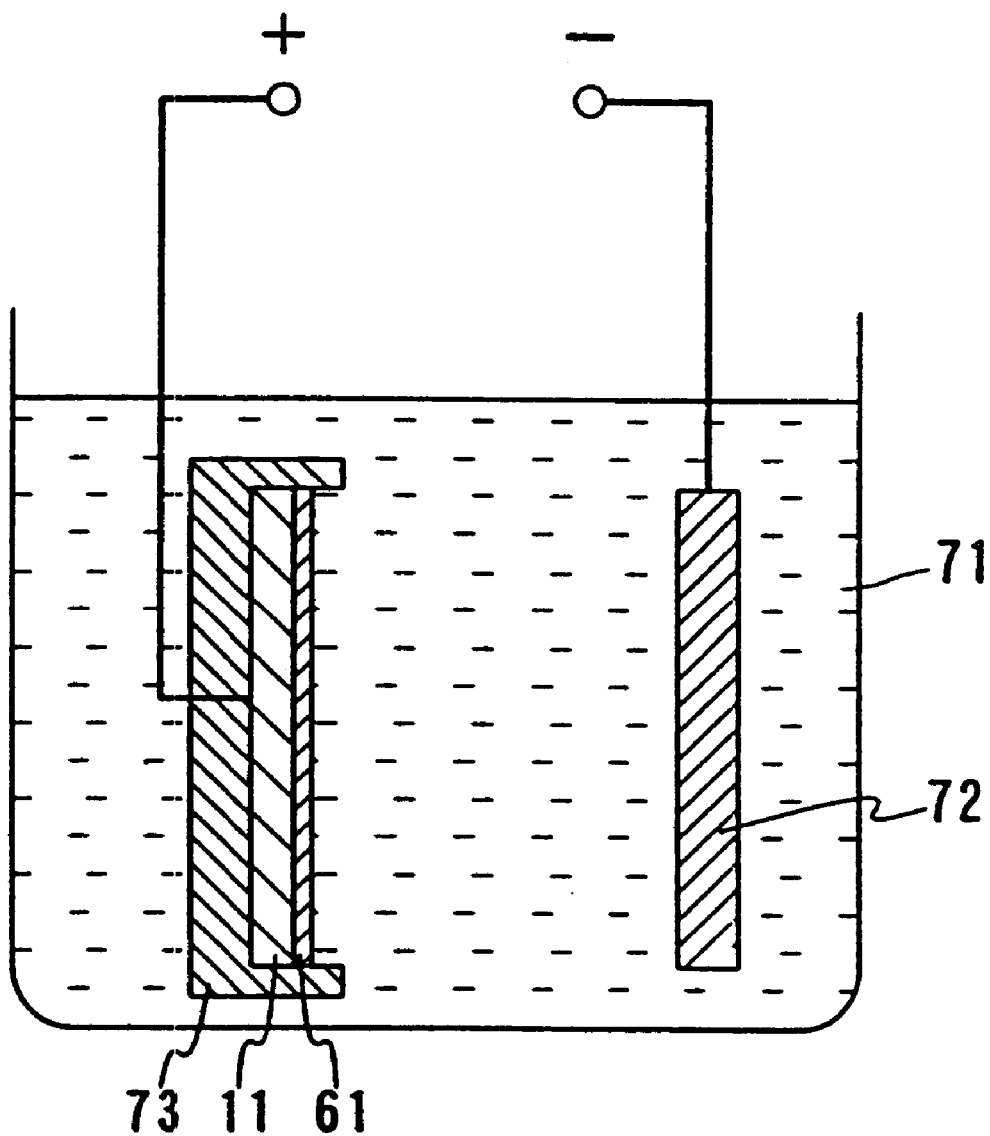
FIG. 7 is a schematic drawing illustrating an example of a step of a method for manufacturing a substrate containing a compound semiconductor layer in accordance with the present invention.

FIG. 7 shows an example of how this voltage is applied. The formation of pores 14 can be performed by immersing the substrate layer 11 with the semiconductor film 61 into the solution 71, and applying a voltage between the semiconductor film 61 and the electrode 72 to generate a current. For example, an aqueous solution of potassium hydroxide is suitable for such a solution 71. Platinum can be used for the electrode 72. For applying a voltage to the semiconductor film 61, an electrode can be formed on the substrate layer 11 or the semiconductor film 61, if necessary. It is preferable that a protective film 73 is formed at the portions wherein the pores 14 are not to be formed. With this process, a plurality of pores 14 can be formed easily in the semiconductor film 61.

The semiconductor film 61 also can be a layered semiconductor film including a non-conducting semiconductor film and a conducting semiconductor film. In this case, it is possible to form the pores only in the conducting semiconductor film, by applying a voltage to the conducting semiconductor film for the etching. Thus, the substrate 10b containing a compound semiconductor layer shown in FIG. 2(b) can be manufactured easily.

Moreover, as has been explained for the second embodiment, it is also possible to remove the substrate layer 11 and the semiconductor layer 12 after the step illustrated in FIG. 6(c). Thus, it is possible to manufacture a substrate containing only a Group III nitride-based compound semiconductor layer.

In the manufacturing method of the third embodiment, the semiconductor layer 12 relaxes the lattice mismatching between the substrate layer 11 and the epitaxial layer 13, and a substrate containing a Group III nitride-based compound semiconductor layer having excellent crystallinity and surface planarity can be obtained. Since the manufacturing method of the third embodiment uses a semiconductor layer 12 that is made of a Group III nitride-based compound semiconductor and has a plurality of pores for this buffer layer, an epitaxial layer 13 with better crystallinity than in conventional manufacturing methods using a regular Group III nitride-based compound semiconductor for the buffer layer can be obtained.

Fourth Embodiment

The following is an explanation of a fourth embodiment of the present invention, referring to an example of a semiconductor device in accordance with the present invention.

A semiconductor device in accordance with the present invention includes a substrate containing a compound semiconductor layer as explained in the above embodiments, or a substrate containing a compound semiconductor layer obtained by a method for manufacturing a substrate containing a compound semiconductor layer as explained in the above embodiments.

The semiconductor device of the present invention can be any kind of semiconductor device including a semiconductor layer made of a Group III nitride-based compound semiconductor. Examples of semiconductor devices for which the present invention is suitable include optical elements such as semiconductor lasers or LEDs, transistors such as field-effect transistors (FETs), and photodiodes.

Figure 8:
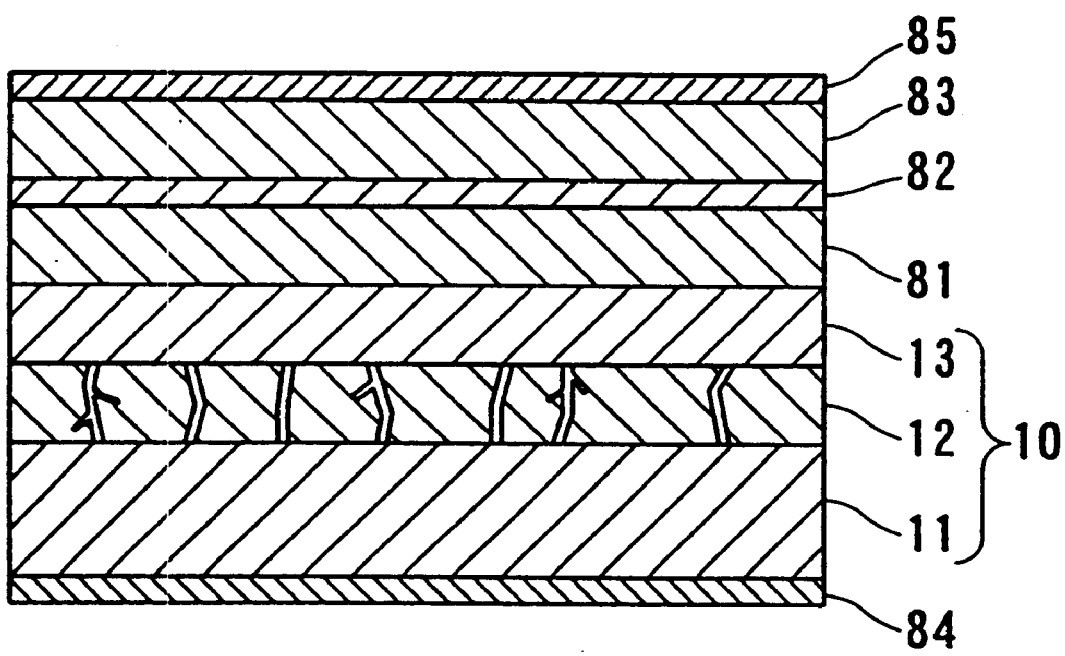
FIG. 8 is a cross-sectional view of an example of a semiconductor device in accordance with the present invention.

FIG. 8 shows a light-emitting element as an example of a semiconductor device in accordance with the present invention. The light-emitting element of this fourth embodiment includes a substrate layer 11, a semiconductor layer 12 deposited on the substrate layer 11, an epitaxial layer 13, a p-type semiconductor layer 81, a light-emitting layer 82, and an n-type semiconductor layer 83, further, a p-side electrode 84 formed on the substrate layer 11, and an n-side electrode 85 formed on the n-type semiconductor layer 83. This means that the light-emitting element of this fourth embodiment includes a substrate 10 including a substrate layer 11, a semiconductor layer 12, and an epitaxial layer 13. The p-type semiconductor layer 81, the light-emitting layer 82, and the n-type semiconductor layer 83, are made of a Group III nitride-based compound semiconductor grown epitaxially on the epitaxial layer 13.

The substrate 10 containing a compound semiconductor layer used for the semiconductor device of this fourth embodiment can be manufactured with the methods explained for the second and third embodiment. The p-type semiconductor layer 81, the light-emitting layer 82, and the n-type semiconductor layer 83 can be formed by MOCVD or HVPE. The p-side electrode 84 and the n-side electrode 85 can be formed by vapor deposition or by sputtering.

In the example shown in FIG. 8, the substrate layer 11, the semiconductor layer 12 and the epitaxial layer 13 are p-type semiconductors. If they are n-type semiconductors, an n-type semiconductor layer, an active layer, and a p-type semiconductor layer are deposited in that order on the substrate 10. Moreover, if the light-emitting element is an LED, the n-side electrode 85 is formed only on a portion of the n-type semiconductor layer 83. Moreover, if the substrate layer 11 is made of an insulating material, the p-side electrode 84 has to be connected to one of the semiconductor layers.

In the substrate containing a compound semiconductor layer in accordance with the present invention and in the substrate containing a compound semiconductor layer manufactured with the manufacturing method of the present invention, the surface planarity and the crystallinity of the epitaxial layer, which is made of a Group III nitride-based compound semiconductor layer are excellent. Consequently, if the semiconductor device of the present invention is a semiconductor laser or an LED, a light-emitting element can be obtained, which can emit light of short wavelengths and which has favorable properties. If the semiconductor device of the present invention is a FET, a FET with favorable properties can be obtained.

EXAMPLES

The following is a more detailed explanation of the present invention by way of examples.

Example 1

The following is an explanation of Example 1, which relates to a substrate containing a compound semiconductor layer in accordance with the present invention and to a method for manufacturing the same.

The substrate of Example 1 includes a substrate layer 11 made of a Si single crystal, a semiconductor layer 12 (thickness: 3 μm) made of Si provided with a plurality of pores 14, and an epitaxial layer 13 (thickness: 1 μm) made of undoped gallium nitride (GaN) (see FIG. 1).

In this configuration, porous Si (the semiconductor layer 12) functioning as a buffer layer is formed on the Si single crystal (substrate layer 11), so that the crystal orientation of the epitaxial layer 13 made of GaN can be aligned, and strain due to the difference of the lattice constants and the thermal expansion coefficient between the substrate layer 11 and the epitaxial layer 13 can be absorbed by the semiconductor layer 12. As a result, the crystallinity of the epitaxial layer 13 is better than in the prior art, and the surface of the epitaxial layer 13 is more even and planar than in the prior art.

The following is an explanation of an example of how this substrate containing a compound semiconductor layer of Example 1 can be manufactured with the manufacturing method of the second embodiment.

In the manufacturing method of Example 1, first, a substrate layer 11 made of a Si single crystal and a semiconductor layer 12 made of porous Si formed on the substrate layer 11 were formed by anodic oxidization of a Si single crystal substrate (substrate 31) (see FIG. 3(b)). The anodic oxidization was performed with the method explained in FIG. 4. An aqueous solution containing 20 wt % hydrofluoric acid and 20 wt % ethanol was used for the solution 41. Then, anodic oxidization was performed by running a current of 20 mA/cm$^2$ for 5 min through the Si single crystal substrate at room temperature, whereby a semiconductor layer 12 made of porous Si was formed.

Thereafter, the substrate layer 11 was placed in a MOCVD device, and an epitaxial layer 13 made of undoped GaN of 1 μm thickness was grown on the semiconductor layer 12 by MOCVD (see FIG. 3(c)). The temperature for this crystal growth of the epitaxial layer 13 was 1000° C.

Trimethyl gallium ((CH$_3$)$_3$Ga) and ammonia (NH$_3$) were used for the reactive gas.

In this manufacturing method, porous Si formed on the Si single crystal substrate functions as a buffer layer, so that the crystal orientation of the GaN epitaxial layer can be aligned, which enhanced the two-dimensional growth of the epitaxial layer. Moreover, since the porous Si has a plurality of pores, the lattice mismatch between the Si single crystal and the Group III nitride-based compound semiconductor can be relaxed, and a Group III nitride-based compound semiconductor with good crystallinity can be grown epitaxially. As a result, a GaN epitaxial layer with better crystallinity and surface planarity than in conventional manufacturing methods could be obtained.

Moreover, in this manufacturing method, anodic oxidization is employed during the formation of the porous Si, so that porous Si can be obtained easily without damaging the Si single crystal substrate. Thus, with this manufacturing method, a substrate containing a GaN epitaxial layer can be manufactured at low costs and with high yield.

The intensity of the photoluminescence (referred to as "PL intensity" below) of a GaN epitaxial layer made with this Example 1 and of a GaN epitaxial layer made with a conventional manufacturing method was measured at 77K. The conventional manufacturing method included forming an AlN buffer layer without pores on a Si substrate, and growing a GaN epitaxial layer on this AlN buffer layer.

Figure 9:
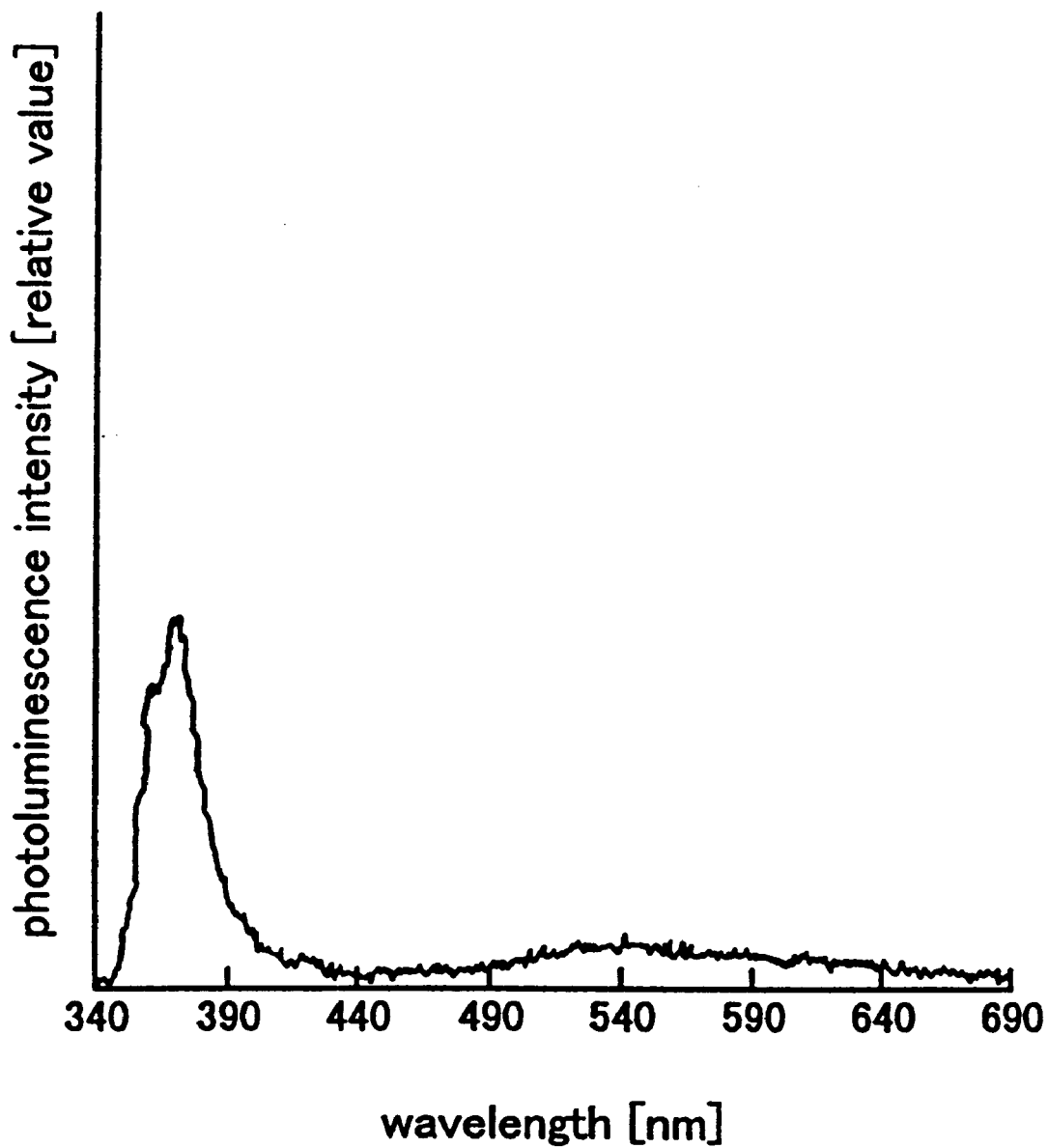
FIG. 9 is a graph showing an example of the measured PL intensity for a substrate containing a compound semiconductor in accordance with the present invention.
Figure 15:
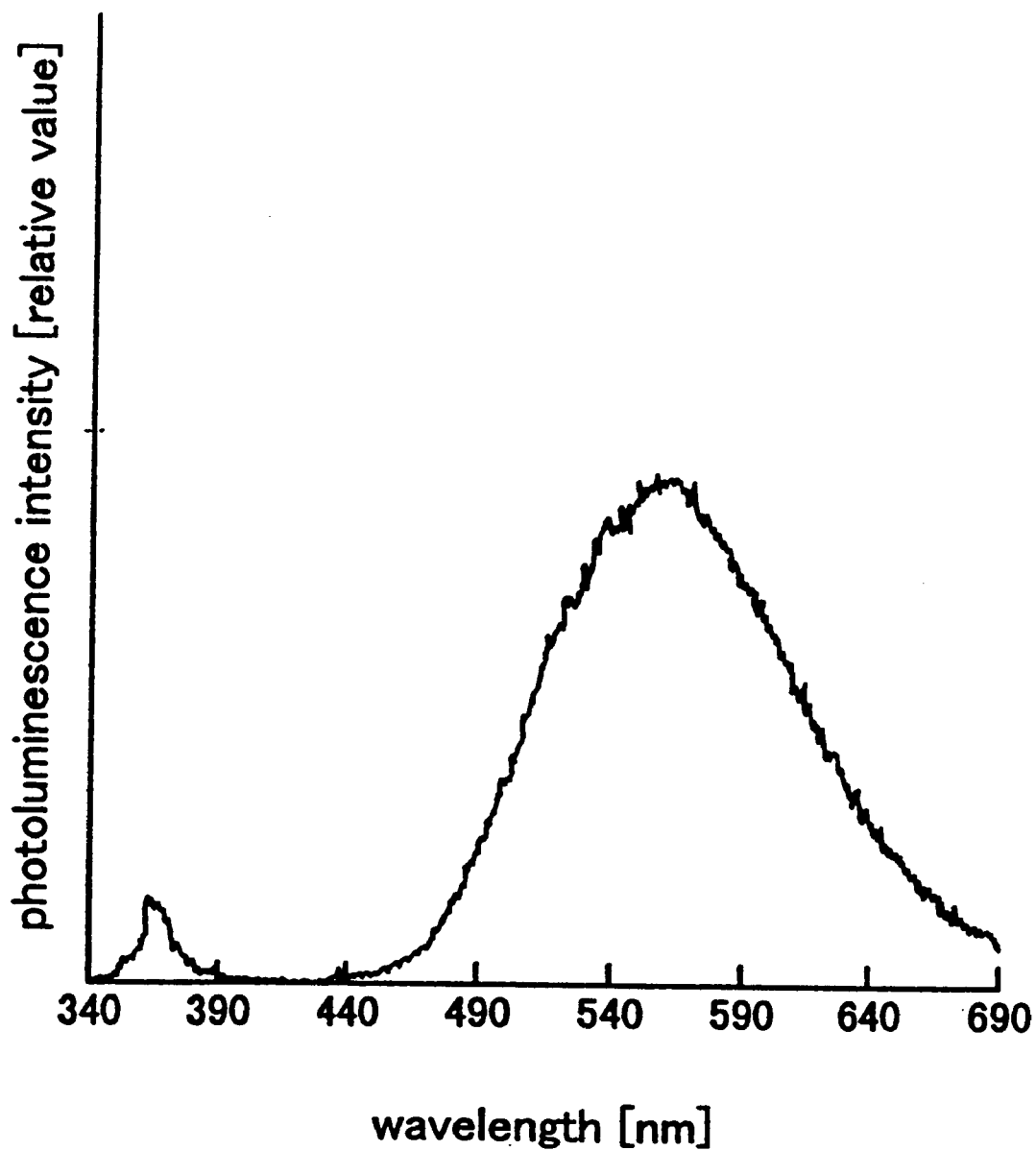
FIG. 15 is a graph showing an example of the measured PL intensity for a conventional substrate containing a compound semiconductor.

The PL intensity of the GaN layer formed with the manufacturing method of Example 1 is shown in FIG. 9, and the PL intensity of the GaN layer formed with the conventional manufacturing method is shown in FIG. 15. As is shown in FIG. 9, the GaN layer formed with the manufacturing method of Example 1 attained the effect that the broad emission from deep electron levels (also called "deep emission" in the following) centering around a 550 nm wavelength was weak, and emissions at the band edge (also called "band edge emissions" in the following) of 354 nm wavelength were strong. On the other hand, with the GaN layer formed with the conventional manufacturing method, the deep emissions were strong and the band edge emissions were weak, as shown in FIG. 15. The band edge emissions of the GaN layer of Example 1 were five times stronger than those in the conventional example.

It is generally known that for the evaluation of the PL intensity of semiconductors, the intensity of the band edge emission and the intensity ratio between the band edge emission and the deep emission are related to the quality of the semiconductor crystal, and that the larger the band edge emission and the intensity ratio between the band edge emission and the deep emission are, the better is its crystallinity. Consequently, it can be seen that the crystallinity of the GaN layer of Example 1 is better than the crystallinity of the conventional GaN layer.

When the surface of the GaN layer of Example 1 was examined with a microscope, it could be ascertained that it is even and planar. On the other hand, the surface of the GaN layer made with the conventional manufacturing method was bumpy and uneven. Thus, whereas with the conventional method for manufacturing a Group III nitride-based compound semiconductor three-dimensional growth occurred and the surface morphology deteriorated, the method for manufacturing a Group III nitride-based compound semiconductor of the present invention caused two-dimensional growth and a favorable surface morphology was attained. It is believed that the reasons for this two-dimensional growth are in the process of initializing the crystal growth of the Group III nitride-based compound semiconductor on the semiconductor layer 12 the dispersion length in the surface of the substrate of nitride atoms and Group III atoms can be made small, so that many growth centers for the growth of the Group III nitride-based compound semiconductor are formed on the substrate surface.

Example 2

The following is an explanation of Example 2, which is another example of a substrate containing a compound semiconductor layer in accordance with the present invention and to a method for manufacturing the same.

The substrate of Example 2 is an example of the substrate 10a including a compound semiconductor layer as explained in FIG. 2(a). The substrate of Example 2 includes a substrate layer made of a Si single crystal (substrate layer 11), a semiconductor layer 15 (thickness: 3 μm) made of porous Si, a semiconductor layer 16 (thickness: 50 nm) made of aluminum nitride (AlN), and an epitaxial layer 13 (thickness: 1 μm) made of undoped gallium nitride (GaN).

In this configuration, AlN (semiconductor layer 16) functioning as a buffer layer is formed on the porous Si (semiconductor layer 15), so that the crystal orientation of the epitaxial layer 13 made of GaN can be aligned, and strain due to the lattice mismatch and the difference of the thermal expansion coefficients between the substrate layer 11 and the epitaxial layer 13 can be absorbed by the semiconductor layer 12 (semiconductor layers 15 and 16). As a result, the crystallinity of the epitaxial layer 13 is higher than in the prior art, and the surface of the epitaxial layer 13 is more even and planar than in the prior art.

The following is an explanation of an example of how this substrate containing a compound semiconductor layer of Example 2 was manufactured with the manufacturing method shown in FIG. 5.

In the manufacturing method of Example 2, first, a Si single crystal substrate (substrate layer 11) and a porous Si layer (semiconductor layer 15) formed on the Si single crystal substrate were formed by anodic oxidization of a Si single crystal substrate (see FIG. 5(a)). The anodic oxidization was performed under the same conditions as in Example 1.

Then, a buffer layer (semiconductor layer 16) made of AlN was formed on the porous Si layer by MOCVD (see FIG. 5(b)). The substrate temperature for the formation of the AlN layer was 800° C. Trimethyl gallium (($CH_3$)$_3$Ga) and ammonia ($NH_3$) were used for the reactive gas.

Thereafter, the substrate layer 11 was placed in a crystal growth furnace, and an epitaxial layer 13 made of undoped GaN of 1 μm thickness was grown on the AlN buffer layer (semiconductor layer 16) by MOCVD (see FIG. 5(c)). This epitaxial layer 13 was grown with the same method as in Example 1.

With this manufacturing method, a buffer layer of AlN could be formed evenly on a porous Si layer. This AlN buffer layer can be recrystallized into a single crystal during the heating step of forming the GaN epitaxial layer. Therefore, a GaN epitaxial layer whose surface is even more even and planar, and whose crystal orientation is better aligned than in Example 1 could be obtained with this manufacturing method.

Figure 10:
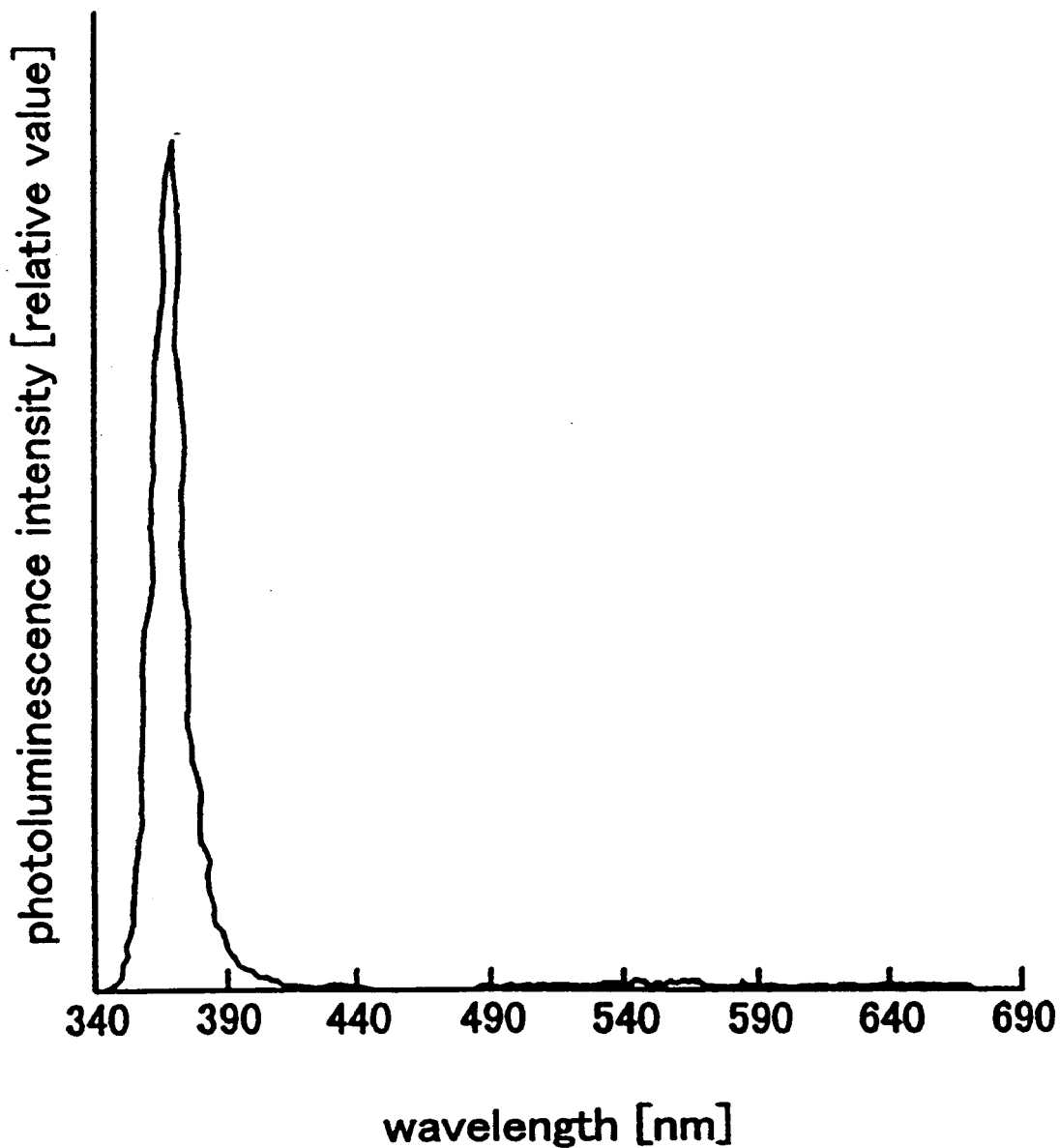
FIG. 10 is a graph showing an example of the measured PL intensity for another substrate containing a compound semiconductor in accordance with the present invention.

The PL intensity of the GaN epitaxial layer formed with the manufacturing method of Example 2 was measured at 77K. The results of this measurement are shown in FIG. 10. As can be seen in FIG. 10, the GaN epitaxial layer of Example 2 exhibits almost no deep emission, and it shows strong band edge emission, which is about twice as high as the band edge emission in Example 1. Thus, it can be seen that the GaN epitaxial layer obtained in this Example 2 has even better crystallinity than the GaN epitaxial layer obtained in Example 1.

Example 3

The following is an explanation of Example 3, which is another example of a substrate containing a compound semiconductor layer in accordance with the present invention and to a method for manufacturing the same.

The substrate of Example 3 is an example of the substrate 10 including a compound semiconductor layer as explained in FIG. 1. The substrate of Example 3 includes a substrate layer 11 made of a p-type Si single crystal, a semiconductor layer 12 (thickness: 50 nm) made of p-type GaN having a plurality of pores 14, and an epitaxial layer 13 (thickness: 2 μm) made of GaN. As a dopant, the semiconductor layer 12 includes Mg with a density of $10^{18}$ cm$^{-3}$ to $10^{21}$ cm$^{-3}$, preferably about $10^{20}$ cm$^{-3}$. The average diameter of the pores 14 is about 3 nm, and their areal density is about $10^{10}$ cm$^{-2}$.

In this configuration, the semiconductor layer 12, which has a plurality of pores 14, functions as a buffer layer.

Therefore, when forming the epitaxial layer 13 on the semiconductor layer 12, strain due to lattice mismatching between the substrate layer 11, which is made of p-type Si, and Group III nitride-based compound semiconductor can be relaxed by the semiconductor layer 12, and defects in the epitaxial layer 13 can be reduced considerably. Also, since the diameter of the pores 14 is about 3 nm small, deterioration of the surface morphology of the epitaxial layer 13 due to the pores 14 can be prevented.

The following is an explanation of an example of how this substrate containing a compound semiconductor layer of Example 3 can be manufactured with the manufacturing method illustrated in FIG. 6.

First, a rinsed p-type Si single crystal substrate (substrate 11) is placed in a MOVPE (metal organic vapor phase epitaxy) device.

Then, this MOVPE device is filled with hydrogen at a pressure of 70 Torr, and the p-type Si single crystal substrate is heated to 1090° C. while introducing ammonia to the hydrogen atmosphere, thereby removing adsorbed gas, oxides, water molecules etc. adhering to the surface of the p-type Si single crystal substrate.

Then, the temperature of the p-type Si single crystal substrate was reduced to 550° C., and with trimethyl gallium, ammonia, and bis-cyclopentadienylmagnesium (Cp$_2$Mg) as source materials, a semiconductor film 61 (thickness: 50 nm) made of p-type GaN was formed on the p-type Si single crystal substrate (see FIG. 6(a)). It is preferable to provide a certain amount of Cp$_2$Mg so that that doping density of the Mg in the semiconductor film 61 is $10^{18}$ cm$^{-3}$ to $10^{21}$ cm$^{-3}$, preferably about $10^{20}$ cm$^{-1}$.

After forming the semiconductor film 61, the substrate was retrieved from the MOVPE device. Then, an electrode for etching was formed on the side of the p-type Si single crystal substrate that is opposite to the side wherein the semiconductor film 61 had been formed.

Then, the substrate layer 11 on which the semiconductor film 61 has been formed was immersed in a solution 71, as shown in FIG. 7, and a current 35 was applied with the semiconductor film 61 serving as the anode and the electrode 72 serving as the cathode. An aqueous hydrochloric acid solution of 0.1 mol/l concentration was used for the solution 71. Platinum was used for the electrode 72. Thus, a plurality of pores 14 were formed in the semiconductor layer 61 made of GaN, and a substrate layer 11 on top of which a semiconductor layer 12 is formed was obtained (see FIG. 6(b)). The size and the number of the pores 14 can be controlled through the thickness of the semiconductor film 61, the added amount of Mg, the applied current, and the time that the current is applied. If the thickness of the semiconductor layer 61 is 50 nm, and the doping density of Mg is $10^{20}$ cm$^{-3}$, pores 14 with an average diameter of 3 nm and an areal density of $10^{10}$ cm$^{-2}$ can be formed by letting a current of about 100 mA flow for about two hours.

Then, the substrate 11 on which the semiconductor layer 12 of GaN had been formed was placed in the MOVPE device again. Then, this MOVPE device was filled with hydrogen at a pressure of 70 Torr, and the substrate 11 was heated to 1050° C. while introducing ammonia to the hydrogen atmosphere, thereby removing adsorbed gas, oxides, water molecules etc. adhering to the surface of the semiconductor layer 12.

Then, the temperature of the substrate 11 was set to 1030° C., and with trimethyl gallium and ammonia as source materials, an epitaxial layer 13 (thickness: 2 μm) made of GaN was formed on the semiconductor layer 12 (see FIG.

6(c)). Thus, a substrate containing a compound semiconductor layer was obtained.

With this manufacturing method, the pores 14 in the semiconductor film 61 could be formed efficiently by using the side of the substrate 11 as the anode when applying the current.

When a cross-section of the thusly formed GaN epitaxial layer was examined with a transmission electron microscope, it could be seen that the defect density in the GaN epitaxial layer was about $10^8$ cm$^{-2}$, which is only about $\frac{1}{100}$ of the defect density of epitaxial layers manufactured with conventional methods.

Furthermore, when the surface of the thusly formed GaN epitaxial layer was examined with an optical microscope, it could be seen that it was planar and there were almost no cracks.

In this example, the same effect also can be achieved using another p-type semiconductor substrate, such as a p-type SiC substrate or a p-type GaAs substrate, instead of the p-type Si substrate.

Example 4

The following is an explanation of Example 4, which is another example of a substrate containing a compound semiconductor layer in accordance with the present invention and to a method for manufacturing the same.

The substrate of Example 4 is an example of the substrate 10b including a compound semiconductor layer as explained in FIG. 2(b). The substrate of Example 4 includes a substrate layer 11 made of sapphire, a semiconductor layer 16 (thickness: 50 nm) made of undoped GaN, a semiconductor layer 15 (thickness: 0.5 μm) made of p-type GaN, and an epitaxial layer 13 (thickness: 2 μm) made of undoped GaN. The semiconductor layer 15 is provided with a plurality of pores 14 and includes Mg with a density of $10^8$ cm$^{-3}$ to $10^{21}$ cm$^{-3}$, preferably about $10^{20}$ cm$^{-3}$ as a dopant. The average diameter of the pores 14 is about 3 nm, and their areal density is about $10^{10}$ cm$^{-2}$.

In this configuration, the semiconductor layer 15, which has a plurality of pores 14, functions as a buffer layer, and therefore can relax strain due to lattice mismatching between the epitaxial layer 13 made of GaN, and the substrate layer 11 made of sapphire. Thus, with this configuration, the number of defects in the epitaxial layer 12 can be reduced considerably. Also, since the diameter of the pores 14 is about 3 nm small, a deterioration of the surface morphology of the epitaxial layer 13 due to the pores 14 can be prevented.

The following is an explanation of an example of how this substrate containing a compound semiconductor layer of Example 4 was manufactured with the manufacturing method of the third embodiment.

First, a rinsed sapphire substrate was placed in a MOVPE device.

Then, this MOVPE device was filled with hydrogen at a pressure of 70 Torr, and the substrate 11 was heated to 1090° C. while introducing ammonia to the hydrogen atmosphere, thereby removing adsorbed gas, oxides, water molecules etc. adhering to the surface of the substrate 11.

Then, the temperature of the sapphire substrate 11 was reduced to 550° C., and with trimethyl gallium and ammonia as source materials, a semiconductor film 16 (thickness: 50 nm) made of undoped GaN was formed on the substrate 11.

Then, the temperature of the substrate 11 was set to 1030° C., and with trimethyl gallium, ammonia, and Cp$_2$Mg as source materials, a semiconductor film (thickness: 0.5 μm) made of p-type GaN was formed on the semiconductor layer 16. Thus, a semiconductor film 61 including a semiconductor layer made of undoped GaN and a semiconductor layer made of p-type GaN was formed (see FIG. 6(a)). When forming the semiconductor layer made of p-type GaN, it is preferable to provide an amount of Cp$_2$Mg so that that doping density of the Mg in the semiconductor film 61 is $10^{18}$ cm$^{-3}$ to $10^{21}$ cm$^{-3}$, preferably about $10^2$ cm$^{-3}$.

After forming the semiconductor layer of p-type GaN, the substrate 11 was retrieved from the MOVPE device. Then, an electrode was formed on the surface of the semiconductor layer of p-type GaN.

Then, the substrate layer 11 on which the semiconductor film 61 has been formed was immersed in a solution 71, as shown in FIG. 7, and a current was applied with the semiconductor film 61 serving as the anode and the electrode 72 serving as the cathode. This was done using the same conditions as in Example 3. Thus, in the semiconductor film 61, a plurality of pores 14 was formed only in the conductive GaN layer, and a semiconductor layer 15 having a plurality of pores 14 was formed (see FIG. 2(b)). The size and the number of the pores 14 can be controlled through the thickness of the p-type GaN layer, the added amount of Mg, the applied current, and the time for which the current is applied. When the thickness of the p-type GaN layer was 0.5 μm, and the doping density of Mg was $10^{20}$ cm$^{-3}$, pores 14 with an average diameter of 3 nm and an areal density of $10^{10}$ cm$^{-2}$ could be formed by letting a current of about 100 mA flow for about thirty minutes.

Then, the substrate 11 was placed in the MOVPE device again, the MOVPE device was filled with hydrogen at a pressure of 70 Torr, and the substrate 11 was heated to 1050° C. while introducing ammonia to the hydrogen atmosphere, thereby removing adsorbed gas, oxides, water molecules etc. adhering to the surface of the p-type GaN layer.

Then, the temperature of the substrate 11 was set to 1030° C., and with trimethyl gallium and ammonia as source materials, an epitaxial layer 13 made of GaN was grown on the p-type GaN layer (semiconductor layer 15). Thus, a substrate 10b containing a compound semiconductor layer was manufactured.

With this manufacturing method, the pores 14 in the p-type GaN layer could be formed efficiently by using the p-type GaN as an anode when applying the current.

When a cross-section of the thusly formed GaN epitaxial layer was examined with a transmission electron microscope, it could be seen that the defect density in the GaN epitaxial layer was about $10^8$ cm$^{-2}$, which is only about $\frac{1}{100}$ of the defect density of epitaxial layers manufactured with conventional methods.

Furthermore, when the surface of the thusly formed GaN epitaxial layer was examined with an optical microscope, it could be seen that it was planar and there were almost no cracks.

A sapphire substrate was used for this Example 4, but the same effect also can be achieved using an insulating substrate such as a spinel substrate, an n-type semiconductor substrate, such as an n-type SiC substrate, an n-type Si substrate, or an n-type GaAs substrate, or a p-type semiconductor substrate, such as a p-type SiC substrate, a p-type Si substrate, or a p-type GaAs substrate, instead of the sapphire substrate.

Example 5

The following is an explanation of Example 5, which is another example of a substrate containing a compound semiconductor layer in accordance with the present invention and to a method for manufacturing the same.

The substrate containing a compound semiconductor layer of Example 5 is made of an undoped GaN crystal of 150 μm thickness. The substrate of Example 5 can be made by forming the substrate 10, 10a, or 10b containing a compound semiconductor layer with the method of the second or the third embodiment, and removing all portions except the epitaxial layer 13.

With reference to FIG. 11, the following explains how the substrate of Example 5 can be manufactured.

Figure 11A:
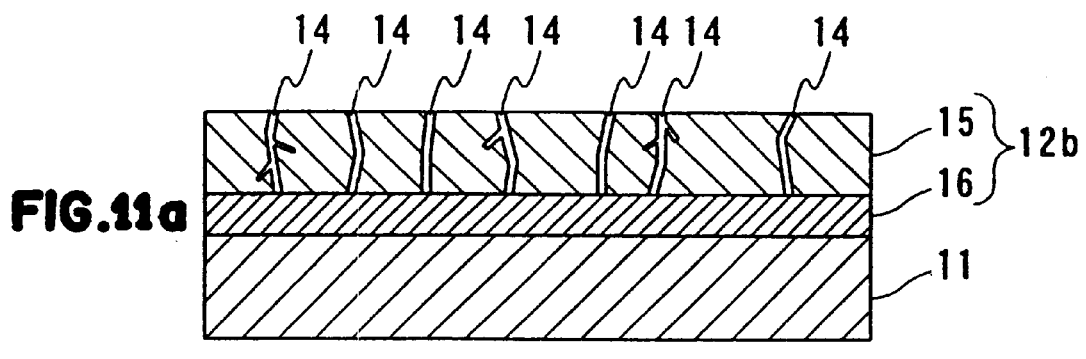
FIGS. 11(a) to 11(c) are drawings illustrating yet another example of a method for manufacturing a substrate containing a compound semiconductor layer in accordance with the present invention.

First, a semiconductor layer 16 (thickness: 50 nm) made of undoped GaN and a semiconductor layer 15 (thickness: 0.5 μm) made of p-type GaN were formed on a sapphire substrate 11, as shown in FIG. 11(a). Thus, a semiconductor layer 12b including a semiconductor layer 16 and a semiconductor layer 15 was formed. The steps for doing this are the same as in Example 4, so that their further explanation has been omitted.

Then, the substrate 11 was placed in a HVPE device, which was filled with hydrogen at a pressure of 70 Torr, and the substrate 11 was heated to 1050° C. while introducing ammonia to the hydrogen atmosphere, thereby removing adsorbed gas, oxides, water molecules etc. adhering to the surface of the semiconductor layer 15.

Figure 11B:
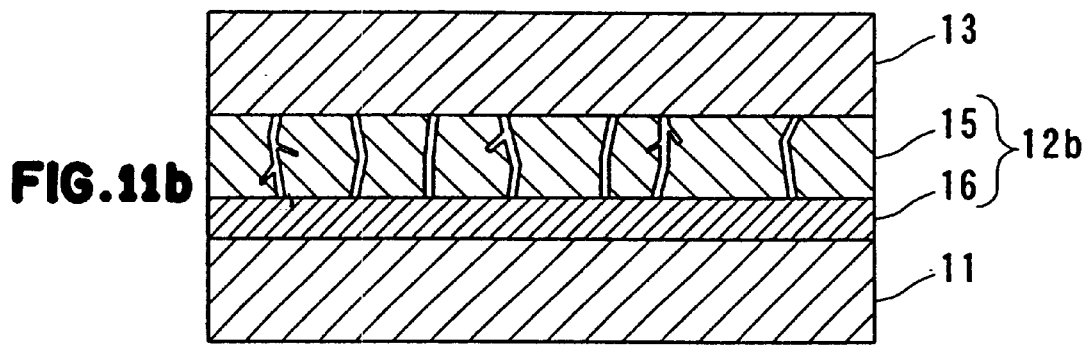

Then, as shown in FIG. 11(b), an epitaxial layer 13 was formed on the semiconductor layer 12b by HVPE. To be specific, the substrate 11 was heated to a temperature of 1030° C., and using gallium chloride ($GaCl_3$) and ammonia as source materials, an epitaxial layer 13 (thickness: 150 μm) made of undoped GaN was formed on the semiconductor layer 12b. Thus, a substrate 10b containing a compound semiconductor layer was manufactured.

Figure 11C:
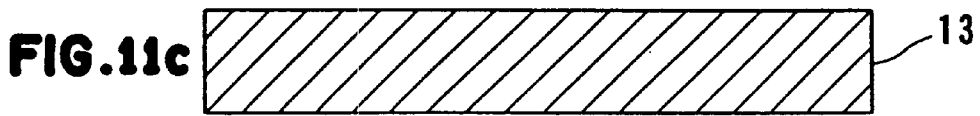

After this, the substrate 11 was retrieved from the HVPE device. Then, removing the substrate 11 and the semiconductor layer 12b by abrasion, a substrate made of an undoped GaN crystal as shown in FIG. 11(c) was obtained.

With this manufacturing method, as in Example 4, the defects in the epitaxial layer 13 could be decreased, so that a semiconductor substrate made of an undoped GaN crystal with few defects and good crystallinity could be obtained.

When a cross-section of the thusly formed undoped GaN substrate was examined with a transmission electron microscope, it could be seen that the defect density in the undoped GaN substrate was about $10^8$ cm$^{-2}$, which is only about 1/100 of the defect density of GaN substrates manufactured with conventional methods.

Furthermore, when the surface of the thusly formed undoped GaN substrate was examined with an optical microscope, it could be seen that it was planar and there were almost no cracks.

A sapphire substrate was used for the substrate 11 in this Example 5, but the same effect also can be achieved using an insulating substrate such as a spinel substrate, an n-type semiconductor substrate, such as an n-type SiC substrate, an n-type Si substrate, or an n-type GaAs substrate, or a p-type semiconductor substrate, such as a p-type SiC substrate, a p-type Si substrate, or a p-type GaAs substrate, instead of the sapphire substrate.

Example 6

The following is an explanation of Example 6, which is an example of a semiconductor device in accordance with the present invention. The semiconductor device of Example 6 is a semiconductor laser.

Figure 12:
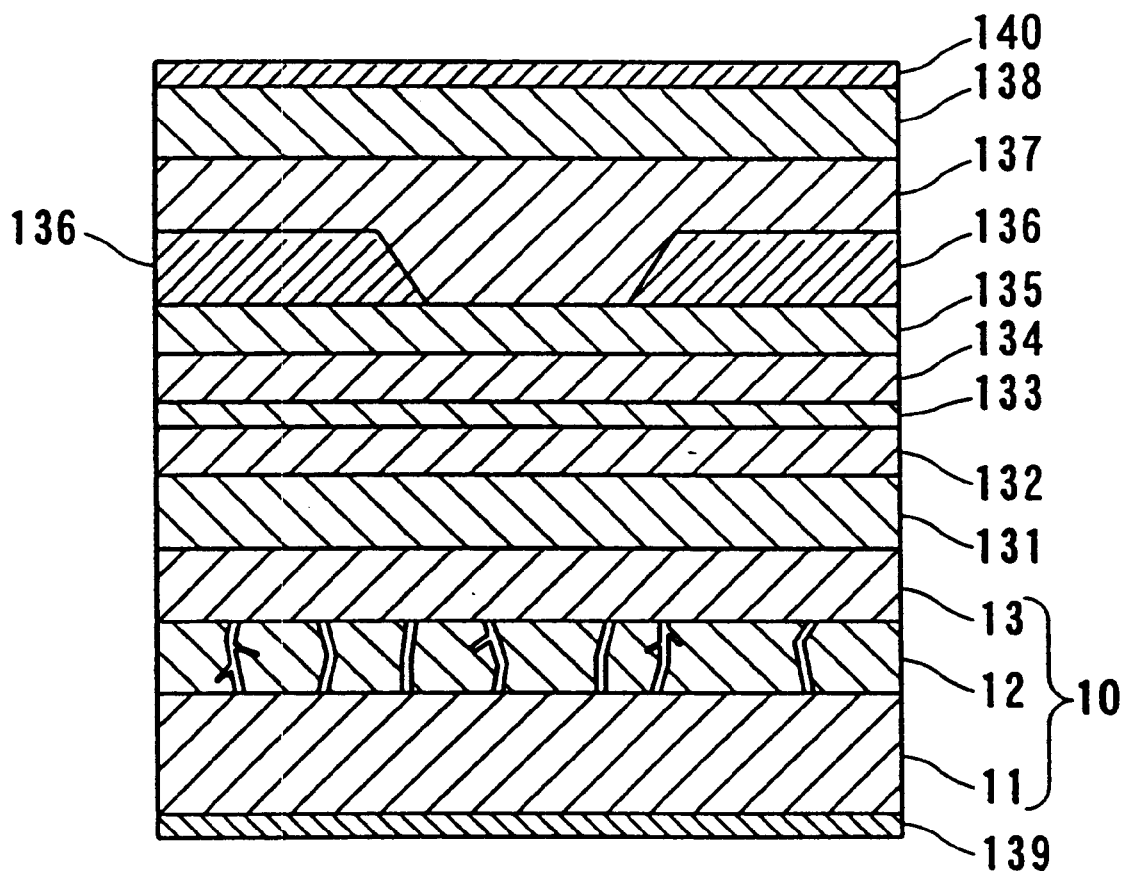
FIG. 12 is a cross-sectional view of another example of a semiconductor device in accordance with the present invention.
Figure 13:
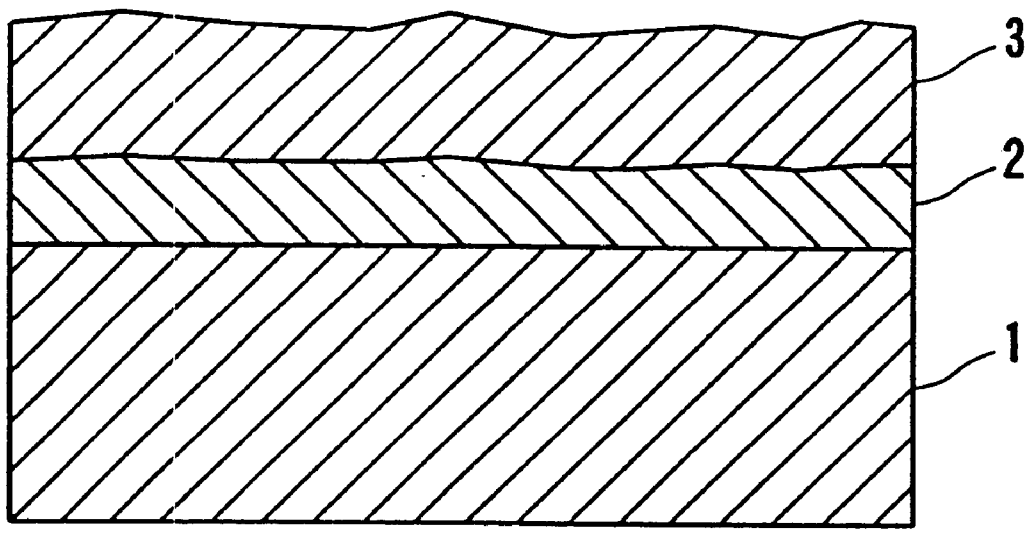
FIG. 13 is a cross-sectional view showing an example of a conventional substrate containing a compound semiconductor layer.
Figure 14A:
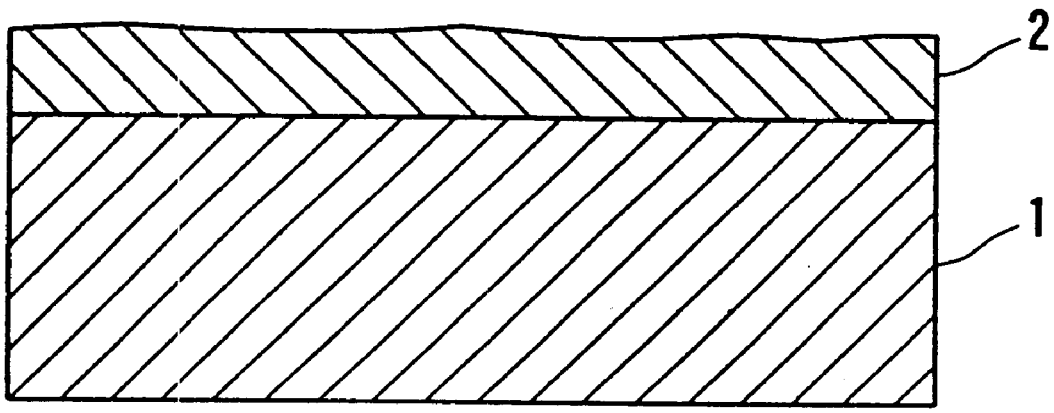
FIGS. 14(a) and 14(b) are drawings illustrating an example of a conventional method for manufacturing a substrate containing a compound semiconductor layer.
Figure 14B:
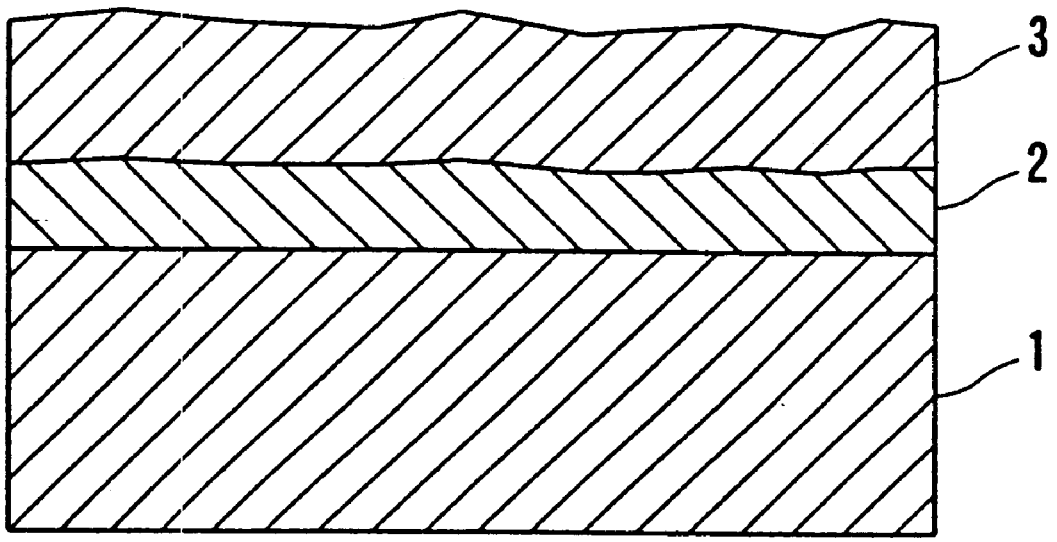

As shown in FIG. 12, the semiconductor laser of this Example 6 includes a substrate layer 11 made of a p-type Si single crystal, a semiconductor layer 12 made of porous Si, an epitaxial layer 13 made of p-type GaN, a p-type cladding layer 131 made of p-type $Al_{0.1}Ga_{0.9}N$, a p-type guiding layer 132 made of p-type GaN, an active layer 133 made of InGaN, a p-type guiding layer 134 made of n-type GaN, an n-type cladding layer 135 made of n-type $Al_{0.1}Ga_{0.9}N$, a current blocking layer 136 made of $SiO_2$, an n-type cladding layer 137 made of n-type $Al_{0.1}Ga_{0.9}N$, and an n-type contact layer 138 made of n-type GaN, deposited in this order on the substrate layer 11, and a p-side electrode 139 and an n-side electrode 140 formed on the two sides of the semiconductor device. Here, the epitaxial layer 13 functions as a contact layer. The active layer 133 includes three quantum well layers made of $In_{0.15}Ga_{0.85}N$ (thickness: 3 nm each) and four barrier layers made of $In_{0.05}Ga_{0.95}N$ (thickness: 5 nm each) deposited alternately.

This semiconductor laser of Example 6 includes a substrate 10 containing a compound semiconductor layer. This substrate 10 includes a substrate layer 11, a semiconductor layer 12, and an epitaxial layer 13.

The following is an explanation of a manufacturing method for the semiconductor of Example 6.

First, a substrate 10 containing a compound semiconductor layer was manufactured with the same method as explained for Example 1. However, in this Example 6, a p-type GaN epitaxial layer was formed by adding Mg during the formation of the epitaxial layer 13.

Then, the layers from the p-type cladding layer 131 to the n-type cladding layer 135 were formed by MOCVD.

Then, the current blocking layer 136 of $SiO_2$ was formed. The current blocking layer 136 was formed by forming an $SiO_2$ layer on the surface of the n-type cladding layer 135, forming a photoresist mask thereon, and etching away the unnecessary portions.

Then, the n-type cladding layer 137 and the n-type contact layer 138 were formed by MOCVD.

Finally, the p-side electrode 139 was formed on the substrate layer 11 made of a p-type Si single crystal, and the n-side electrode 140 was formed on the n-type GaN contact layer 138 by vapor deposition, thereby obtaining the semiconductor laser of Example 6.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

For example, the semiconductor devices explained in the above embodiments are only examples, and the present invention can be applied to a wide variety of other semiconductor devices as well.

What is claimed is:

1. A substrate containing a compound semiconductor layer, the substrate comprising:

a substrate layer;

a first semiconductor layer formed on said substrate layer;

a second semiconductor layer formed on said first semiconductor layer;

wherein said first semiconductor layer has a plurality of pores, and said second semiconductor layer is an epitaxial layer made of a Group III nitride-based compound semiconductor.

2. The substrate according to claim 1, wherein said first semiconductor layer is a buffer layer.

3. The substrate according to claim 2, wherein said substrate layer is made of a Si single crystal, and said first semiconductor layer is made of a Si single crystal having a plurality of pores.

4. The substrate according to claim 2, wherein said substrate layer is made of a Si single crystal, and said first semiconductor layer comprises a Si single crystal layer having a plurality of pores, and a Group III nitride-based compound semiconductor layer formed on said Si single crystal layer.

5. The substrate according to claim 2, wherein said first semiconductor layer is made of a Group III nitride-based compound semiconductor.

6. The substrate according to claim 5, wherein said first semiconductor layer comprises a dopant.

7. The substrate according to claim 2, wherein an average diameter of said pores is at least 3 nm and at most 10 nm.

8. A method for manufacturing a substrate containing a compound semiconductor layer, the method comprising a first step of forming a semiconductor layer having a plurality of pores on a substrate layer; and a second step of epitaxially growing a Group III nitride-based compound semiconductor layer on said semiconductor layer.

9. The method of claim 8, wherein said substrate layer is made of a Si single crystal;

said semiconductor layer comprises a Si single crystal layer provided with a plurality of pores; and said first step comprises anodic oxidization of the Si single crystal.

10. The method of claim 9, wherein said semiconductor layer further comprises a buffer layer made of a Group III nitride-based compound semiconductor formed on the Si single crystal layer; and said first step comprises forming said buffer layer on said Si single crystal layer after said anodic oxidization.

11. The method of claim 8, wherein said semiconductor layer is made of a Group III nitride-based compound semiconductor.

12. The method of claim 11, wherein said first step comprises forming a semiconductor film made of a Group III nitride-based compound semiconductor on said substrate layer, and subsequently providing said semiconductor film with pores by etching said semiconductor film in an acid or basic aqueous solution.

13. The method of claim 12, wherein said semiconductor film comprises a dopant; and said first step further comprises applying a voltage to said semiconductor film while etching said semiconductor film.

14. The method of claim 8, further comprising a third step of forming a substrate made of a Group III nitride-based compound semiconductor by removing said substrate layer and said semiconductor layer.

15. A semiconductor device comprising the substrate claimed in claim 1.

16. A semiconductor device comprising the substrate manufactured by the method claimed in claim 8.

17. A semiconductor device comprising the substrate manufactured by the method claimed in claim 14.

* * * * *